(12) United States Patent
Lee et al.

(10) Patent No.: US 7,549,133 B2
(45) Date of Patent: Jun. 16, 2009

(54) SYSTEM AND METHOD FOR QUALIFYING A LOGIC CELL LIBRARY

(75) Inventors: Sung Youn Lee, Seoul (KR); Yong Chul Jeon, Goyang-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 191 days.

(21) Appl. No.: 11/645,527

(22) Filed: Dec. 27, 2006

(65) Prior Publication Data

US 2007/0148705 A1 Jun. 28, 2007

(30) Foreign Application Priority Data

Dec. 27, 2005 (KR) .................. 10-2005-0130780

(51) Int. Cl.
*G06F 17/50* (2006.01)
(52) U.S. Cl. ............................. 716/1; 716/18
(58) Field of Classification Search .............. 716/1, 716/2, 18
See application file for complete search history.

(56) References Cited

U.S. PATENT DOCUMENTS

| | | | |
|---|---|---|---|
| 6,195,786 B1 * | 2/2001 | Raghunathan et al. | 716/2 |
| 6,505,322 B2 * | 1/2003 | Yamashita et al. | 716/1 |
| 6,574,779 B2 * | 6/2003 | Allen et al. | 716/1 |

* cited by examiner

*Primary Examiner*—Thuan Do
*Assistant Examiner*—Binh C Tat
(74) *Attorney, Agent, or Firm*—Finnegan, Henderson, Farabow, Garrett & Dunner, L.L.P.

(57) ABSTRACT

A system and a method for qualifying a logic cell library storing process parameters and properties of a specific semiconductor FAB when the logic cell library is newly developed or modified is provided. The system for qualifying a logic cell library which qualifies a new library and a modified library, includes a format transformer for transforming formats of the new library and the modified library into formats suitable for a predetermined qualifier, a sample generator for creating a qualification cell sample capable of qualifying all cells by using cells of the new or modified library having a transformed format, a cell matching tool for performing a one-to-one cell comparison between cells of the new library and cells of an existing library, a function qualifier for determining whether or not a right value is output with respect to an input value in order to qualify a cell function of the new or modified library, a processing rate qualifier for measuring a time required from signal input to signal output in order to qualify a cell processing rate of the new or modified library, a power consumption qualifier for measuring power consumed during a process of a cell of the new or modified library, and an inter-qualifier for determining whether or not logical design information and physical design information of the new or modified library suitably corresponds to each other.

13 Claims, 3 Drawing Sheets

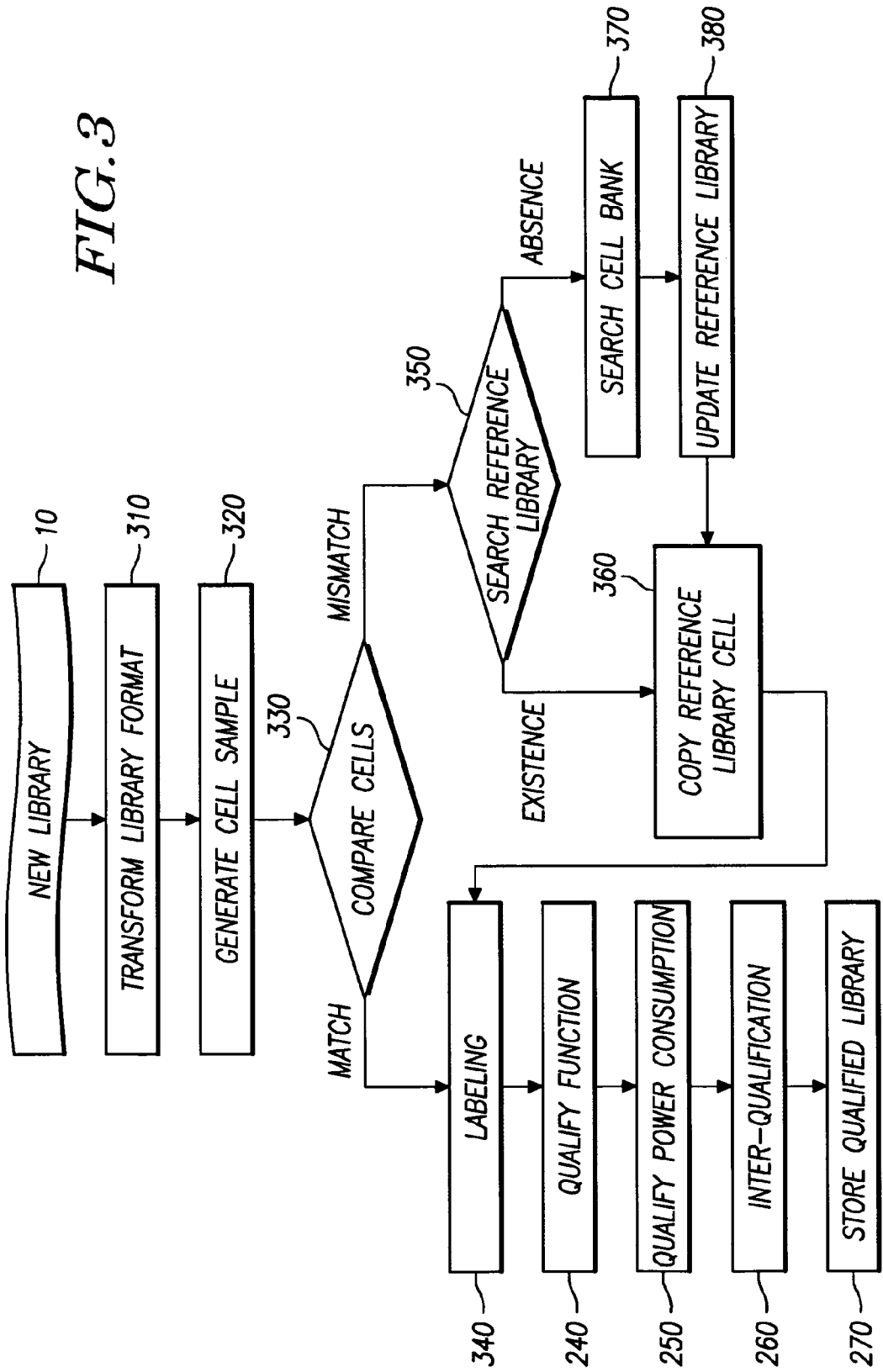

SYSTEM AND METHOD FOR QUALIFYING A LOGIC CELL LIBRARY

This application is based upon and claims the benefit of priority to Korean Application No. 10-2005-0130780, filed on Dec. 27, 2005, the entire contents of which are incorporated herein by reference.

BACKGROUND

1. Technical Field

The present invention relates to a logic cell library. More specifically, the present invention relates to a system and a method for efficiently qualifying a logic cell library storing process parameters and properties of a specific semiconductor FAB when the logic cell library is newly developed or modified.

2. Description of the Related Art

Foundry corporations mainly making an application-specific integrated circuit (ASIC) or a system-on-chip (SoC) while managing there own semiconductor FAB store specific process parameters and properties, which are suitable for the semiconductor FAB, in the form of a library. When a customer orders the foundry corporation to make a certain semiconductor product, the foundry corporation provides the customer with libraries of the semiconductor FAB suitable for the order of the customer, and the customer designs the semiconductor product suitable for the semiconductor FAB of the foundry corporation by using the provided libraries. Accordingly, since the libraries are the most important materials provided to the customer, the customer demands qualified libraries.

However, according to the development of semiconductor process technology or the demand of the customer, a logic cell library is frequently modified or newly developed. In this case, it must be determined whether or not the modified library or the new library is actually suitable for a semiconductor FAB. If the modified library or the new library is actually suitable for the semiconductor FAB, the modified library or the new library must be qualified.

In general, a semiconductor chip includes various types of blocks, and each block includes logic cells. The logic cell library has various information about each cell, such as cell size, signal processing time (timing) from signal input to signal output, and power consumed in signal processing. However, since several hundreds of logic cells exist and various properties must be qualified, time and effort is necessary to qualify all logic cells of the logic cell library. In addition, when a worker qualifies the logic cells in person, the worker may make a mistake.

BRIEF SUMMARY

Therefore, consistent with the present invention there is provided a system and a method for qualifying a logic cell library, capable of rapidly, precisely, and effectively realizing the qualification of a modified library or a newly developed library.

Consistent with the present invention, there is provided a system for qualifying a logic cell library which qualifies a new library and a modified library, the system including a format transformer for transforming formats of the new library and the modified library into formats suitable for a predetermined qualifier, a sample generator for creating a qualification cell sample capable of qualifying all cells by using cells of the new or modified library having a transformed format, a cell matching tool for performing a one-to-one cell comparison between cells of the new library and cells of an existing library, a function qualifier for determining whether or not a right value is output with respect to an input value in order to qualify a cell function of the new or modified library, a processing rate qualifier for measuring a time required from signal input to signal output in order to qualify a cell processing rate of the new or modified library, a power consumption qualifier for measuring power consumed during a process of a cell of the new or modified library, and an inter-qualifier for determining whether or not logical design information and physical design information of the new or modified library suitably corresponds to each other.

The system further includes a performance estimator for estimating cell performance and library performance of the new or modified library in comparison with cell performance and library performance of the existing library, and a simulator for simulating a qualification cell sample circuit of the new or modified library and a cell sample circuit of the existing library, thereby determining whether or not waveforms of simulation results are identical to each other.

The sample generator includes a sample generating circuit having a structure in which all cells of the new or modified library are connected to each other.

According to another aspect consistent with the present invention, there is provided a method for qualifying a logic cell library, the method including the steps of transforming a format of a library suitable for a format required in a qualification system, generating a qualification cell sample by selecting a cell required for qualification such that all cells of the library are easily qualified, qualifying a cell function of the library by determining whether or not a right value is output with respect to an input value, qualifying a cell processing rate of the library by measuring a time from signal input to signal output, qualifying cell power consumption of the library by measuring power consumed during signal processing of a cell, qualifying whether or not logical design information and physical design information of the library suitably correspond to each other, and storing a qualified library.

The library is a modified library formed by modifying a process parameter and a process property of an existing library into a new process parameter and a new property.

The library is a new library formed by newly developing physical design information of a library based on an existing library. The method further includes performing a one-to-one cell comparison with respect to a new physical library and a logical library of a reference library, and generating a qualification cell sample naming the new library if cells serving a same function correspond to each other one-to-one.

The method further includes performing a one-to-one cell comparison with respect to a new physical library and a logical library of a reference library, searching the logical library of the reference library if a cell, which is not in one-to-one correspondence, exists among cells performing a same function, copying the cell to be applied to the new library if the cell exists in the reference library, and generating a qualification cell sample naming the new library.

The method further includes performing a one-to-one cell comparison with respect to a new physical library and a logical library of a reference library, searching the logical library of the reference library if a cell, which is not in one-to-one correspondence, exists among cells performing a same function, searching a cell bank if the cell is not in the reference library, obtaining the cell from a logical library of the cell bank and updating the reference library, copying the cell to be applied to the new library, and naming the new library.

BRIEF DESCRIPTION OF DRAWINGS

FIG. 3 is a flowchart showing a method for qualifying a logic cell library according to another embodiment consistent with the present invention.

DETAILED DESCRIPTION OF THE INVENTION

Hereinafter, a preferred embodiment consistent with the present invention will be described in detail with reference to the following drawings.

Figure 1:
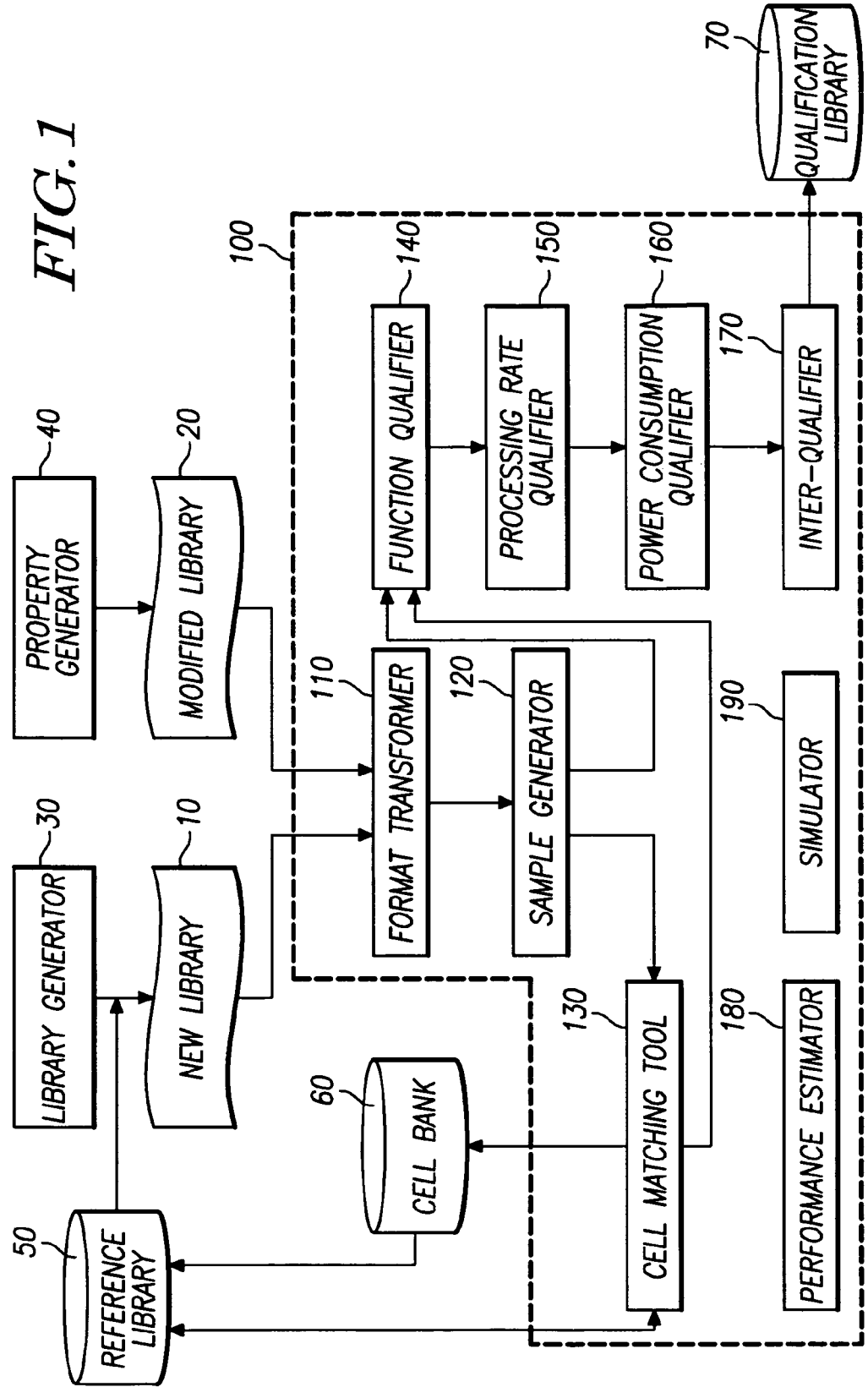
FIG. 1 is a block diagram showing a structure of a system for qualifying a logic cell library consistent with the present invention.

FIG. 1 is a block diagram showing a structure of a system 100 for qualifying a logic cell library consistent with the present invention.

Referring FIG. 1, logic cell library qualifying system 100 qualifies a new library 10 or a modified library 20. New library 10 is formed by newly making physical design information, and modified library 20 is formed by modifying process parameters or properties of an existing library into new process parameters or properties. New library 10 is made by a well-known library generator 30. Library generator 30 uses the existing library stored in a reference library 50 as a reference. Modified library 20 is created by a well-known property generator 40.

Logic cell library qualifying system 100 includes a format transformer 110 and a sample generator 120. Generally, since a library has various formats, logic cell library qualifying system 100 changes the format of the library into a format suitable for each qualifier by using format transformer 110 in order to qualify the library. In particular, since a library format created by library generator 30 differs from a library format required by logic cell library qualifying system 100, new library 10 must be first subject to format transformer 110. Sample generator 120 automatically creates qualification cell samples by using each cell such that all cells are easily verified. Sample generator 120 includes a sample creating circuit having a structure in which all cells are connected to each other, and has a document of a text format capable of selecting only a cell to be qualified. In this case, only an on/off function is set so as to make a qualification circuit of desired cells. If the qualification cell samples are used, it may be unnecessary to qualify all logic cells.

Logic cell library qualifying system 100 further includes a cell matching tool 130. If new library 10 is developed, cell matching tool 130 performs a one-to-one cell comparison between a logical library existing in a reference library 50 and new library 10. If cells having the same functions correspond to each other one-to one, cell matching tool 130 determines that there is no problem and automatically names new library 10. If a predetermined function exists in the existing logical library, but does not exist in new library 10, cell matching tool 130 copies the function from the existing logical library and applies the copied function to new library 10. If cells, which are not provided in the logical library of reference library 50, exist in new library 10, cell matching tool 130 searches for the cells in a cell bank 60 and updates reference library 50 with the cells such that reference library 50 is used as a reference when other libraries are developed.

The input of cell matching tool 130 is a physical library. The cell comparison may be a process of making a logical library that is a one-to-one match with the physical library. In other words, if the logical library corresponding to the physical library is searched in the existing library, the logical library is copied to make a set together with the physical library.

Logic cell library qualifying system 100 further includes a function qualifier 140, a processing rate qualifier 150, a power consumption qualifier 160, and an inter-qualifier 170. Function qualifier 140 qualifies cell functions of new and modified libraries 10 and 20. Function qualifier 140 qualifies whether or not a right value is output with respect to an input value. Processing rate qualifier 150 measures a time required from signal input to signal output. In other words, processing rate qualifier 150 measures a cell processing rate. Power consumption qualifier 160 measures the power consumed during cell processing. In addition, inter-qualifier 170 qualifies whether or not logical design information of a library suitably corresponds to physical design information of the library.

In addition, logic cell library qualifying system 100 further includes a performance estimator 180 and a simulator 190. Performance estimator 180 estimates cell performance and each library performance of new library 10 or modified library 20 by comparing the cell performance and the library performance with those of the existing library. Simulator 190 performs simulation for a qualification cell sample circuit of new library 10 or modified library 20 and a qualification cell sample circuit of the existing library and determines whether or not simulation waveforms of the qualification cell sample circuits are identical to each other.

Hereinafter, a method for qualifying a logic cell library by using logic cell library qualifying system 100 will be described. The following description will make the structure of the local cell library qualifying system more clear.

Figure 2:
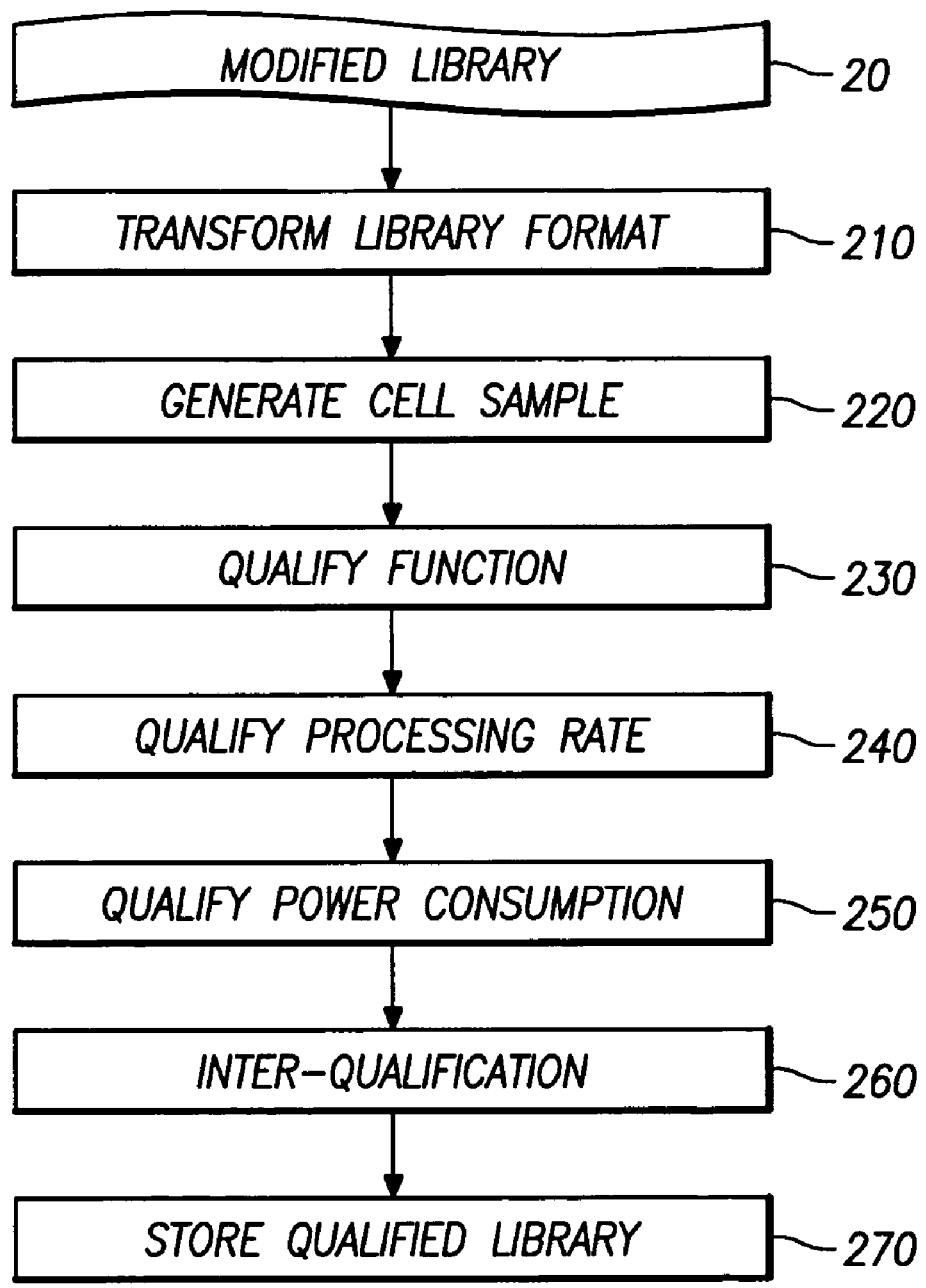
FIG. 2 is a flowchart showing a method for qualifying a logic cell library according to an embodiment consistent with the present invention.

FIG. 2 is a flowchart showing a method for qualifying a logic cell library according to an embodiment consistent with the present invention. That is, FIG. 2 shows a method for qualifying the modified library when a library is changed into another library based on process parameters or properties of the existing library.

Referring to FIGS. 1 and 2, if modified library 20 is created by using property generator 40, the format of modified library 20 is transformed through format transformer 110. A library may exist in various formats, and qualifiers 140, 150, 160, and 170 of logic cell qualifying system 100 may require various formats of the library. In addition, generally, the format of a library differs from a format required in each qualifier. Accordingly, step 210 of transforming the format of a library is required before qualifying the library.

If the format of modified library 20 is changed into a suitable format, a qualification cell sample is created by using sample generator 120 (step 220). In this case, the qualification cell sample includes a qualification circuit for selecting only cells to be qualified such that all cells of modified library 20 can be easily qualified.

If the qualification cell sample is created, a cell function of modified library 20 is qualified through function qualifier 140 (step 230). In other words, it is determined that a right value is output with respect to an input value. For example, on the assumption that result values of 0 and 1 represent a voltage level of 0V and an actually applied voltage level (e.g., 3.3V) in a cell outputting the result values of 0 and 1, if a voltage level of 3.3V is applied to a circuit, the voltage level of 0V increases to the voltage level of 3.3V if there is no problem in any characteristic of a circuit, so a signal having the value of 1 is output from a signal having a value of 0. However, if a voltage level of 1.8V is actually input even though the voltage level of 3.3V is applied due to the problem in the characteristic of the circuit, the result values of 0 and 0 are output. In this case, function qualifier 140 determines malfunction of modified library 20.

A processing rate of modified library 20 is qualified by using processing rate qualifier 150 (step 240). In other words, processing rate qualifier 150 measures a cell processing rate that refers to a time from signal input to signal output in the cell. As a result, the cell processing rate shows characteristics relating to moving rates of electrons.

Power consumption of modified library 20 is qualified by using power consumption qualifier 160 (step 250). In other words, power consumption qualifier 160 measures the power consumed during signal processing of a cell. The power consumption may vary depending on the design of circuits.

It is qualified by using inter-qualifier 170 whether or not logical design information of modified library 20 suitably corresponds to physical design information of the modified library 20 (step 260). The logical design information represents information of circuits (e.g., adder, subtractor, etc.) having various logical functions. The physical design information represents the physical structure of the circuit. For example, the physical design information represents information about the thickness or the area of a metal interconnection which is a connection line of the adder.

If a series of processes of qualifying a library is completely performed as described above, the qualified library is stored (step 270).

FIG. 3 is a flowchart showing a method for qualifying a logic cell library according to another embodiment consistent with the present invention. That is, FIG. 3 shows a method for qualifying new library 10 when physical design information of a library is newly developed with reference to the existing library.

Referring to FIGS. 1 and 3, if new library 10 is created through library generator 30, the format of new library 10 is changed through format transformer 110 similarly to the modified library (step 310). Then, a qualification cell sample is created by using sample generator 120 (step 320).

If the qualification cell sample is created, cell matching tool 130 performs one-to-one cell comparison between new physical library 10 and the existing logical library provided in a reference library 50 by using cell matching tool 130 (step 330). If all cells having the same function match with each other one-to-one as a result of the cell comparison (match), it is determined that there is no problem in new library 10 so that a name is automatically assigned to new library 10 (step 340). Then, qualification steps 230 to 260 of modified library 20 are performed as described above, and then the qualified new library is stored (step 270).

If there is a cell which does not match with other cells one-to-one (mismatch), the cell is searched in the existing logical library of reference library 50 (step 350). If the cell exists in reference library 50 (match), the cell is copied form the existing logical library and applied to new library 10 (step 360). New library 10 is named (step 340) and then subject to following qualification steps. If the cell does not exist in reference library 50 (mismatch), the cell is searched in cell bank 60 (step 370). The cell is obtained from the existing logical library of cell bank 60, so that reference library 50 is updated (step 380). Thereafter, the cell is copied and applied to new library 10 (step 360), and is named (step 340).

As described above, according to a system and a method for qualifying a logic cell library consistent with the present invention, when a logic cell library is newly developed, or the property of the logic cell library is changed, the qualification of the logic cell library can be quickly, precisely, and effectively realized, so that it is possible to provide a customer with the logic cell library.

It will be apparent by those skilled in the art that various changes and modifications may be made without departing from the spirit and scope consistent with the invention as defined in the following claims.

What is claimed is:

1. A system for qualifying a logic cell library, the system comprising:
    a format transformer transforming a new library into a format suitable for a predetermined qualifier;
    a sample generator creating a qualification cell sample capable of qualifying cells of the new library;
    a cell matching tool performing a one-to-one cell comparison between cells of the new library and cells of an existing library and, if a mismatched cell of the new library does not exist in the existing library, updating the existing library by obtaining the mismatched cell from a cell bank;
    a function qualifier determining whether or not a right value is output with respect to an input value in order to qualify a cell function of the new library;
    a processing rate qualifier measuring a time required from signal input to signal output in order to qualify a cell processing rate of the new library;
    a power consumption qualifier measuring power consumed during a process of a cell of the new library;
    an inter-qualifier determining whether or not logical design information and physical design information of the new library suitably correspond to each other; and
    a qualification library storing the new library qualified by the function qualifier, the processing rate qualifier, the power consumption qualifier, and the inter-qualifier.

2. The system according to claim 1, further comprising a performance estimator estimating cell performance and library performance of the new library in comparison with cell performance and library performance of the existing library.

3. The system according to claim 1, further comprising a simulator simulating a qualification cell sample circuit of the new library and a cell sample circuit of the existing library, thereby determining whether or not waveforms of simulation results are identical to each other.

4. The system according to claim 1, wherein the sample generator includes a sample generating circuit having a structure in which all cells of the new library are connected to each other.

5. The system according to claim 1, wherein, if cells of the same function have a one-to-one correspondence with each other, the cell matching tool names the new library according to the generated qualification cell sample.

6. The system according to claim 1, wherein, if a cell not in one-to-one correspondence exists among cells performing the same function, the cell matching tool searches a logical library of the existing library, and if the cell exists in the logical library, the cell to be applied to the new library is copied and stored in the qualification library under a new name according to the generated qualification cell sample.

7. The system according to claim 6, wherein, if the cell is not in the logical library, the cell matching tool searches the cell bank to obtain the cell from a logical library of the cell bank.

8. A method for qualifying a logic cell library, the method comprising using a machine to perform the steps of:
    transforming a library into a format suitable for qualifying the library in a qualification system;

generating a qualification cell sample by selecting from the library a cell required for qualification so as to qualify all cells of the library;

performing a one-to-one cell comparison with respect to cells of the library and cells of a reference library;

if a mismatched cell of the library does not exist in the reference library, updating the reference library by obtaining the mismatched cell from a cell bank;

qualifying a cell function of the library by determining whether or not a right value is output with respect to an input value;

qualifying a cell processing rate of the library by measuring a time from signal input to signal output;

qualifying cell power consumption of the library by measuring power consumed during signal processing of a cell;

inter-qualifying the library by determining whether or not logical design information and physical design information of the library suitably correspond to each other; and storing the library as a qualified library after qualifying the cell function, the cell processing rate, and the cell power consumption of the library, and after inter-qualifying the library.

9. The method according to claim 8, wherein the library is a modified library formed by modifying a process parameter and a process property of an existing library into a new process parameter and a new property.

10. The method according to claim 8, wherein the library is a new library formed by newly developing physical design information of a library based on an existing library.

11. The method according to claim 10, further comprising:
naming the new library according to the generated qualification cell sample, if cells of the new library and the existing library having the same function correspond to each other one-to-one.

12. The method according to claim 10, further comprising:
searching the reference library if a cell, which is not in one-to-one correspondence, exists among cells performing the same function;
copying the cell to be applied to the new library and naming the new library according to the generated qualification cell sample, if the cell exists in the reference library.

13. The method according to claim 12, wherein, if the cell is not in the reference library, the method further comprises:
searching the cell bank to obtain the cell from a logical library of the cell bank.

* * * * *